US006476656B2

(12) United States Patent
Dally et al.

(10) Patent No.: US 6,476,656 B2
(45) **Date of Patent: *Nov. 5, 2002**

(54) LOW-POWER LOW-JITTER VARIABLE DELAY TIMING CIRCUIT

(75) Inventors: William J. Dally, Stanford; Ramin Farjad-Rad, Mountain View; Teva J. Stone, San Jose; Xiaoying Yu, Milpitas, all of CA (US); John W. Poulton, Chapel Hill, NC (US)

(73) Assignee: Velio Communications, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/925,753

(22) Filed: Aug. 9, 2001

(65) Prior Publication Data

US 2001/0054925 A1 Dec. 27, 2001

Related U.S. Application Data

(63) Continuation of application No. 09/453,368, filed on Dec. 1, 1999, now Pat. No. 6,316,987.

(60) Provisional application No. 60/160,950, filed on Oct. 22, 1999.

(51) Int. Cl.7 ........................ H03H 11/26

(52) U.S. Cl. ........................ 327/276; 327/538; 327/540

(58) Field of Search ........................ 327/261, 262, 327/271, 274, 277, 280, 284, 287, 538, 540, 541, 543, 276; 330/127, 252, 253, 254

(56) References Cited

U.S. PATENT DOCUMENTS

| | | | | |
|---|---|---|---|---|
| 4,922,141 A | | 5/1990 | Lofgren et al. | 327/158 |
| 5,473,277 A | | 12/1995 | Furumochi | 327/543 |
| 5,532,653 A | | 7/1996 | Adkins | 327/537 |
| 5,576,656 A | | 11/1996 | McClure | 327/538 |
| 5,596,297 A | | 1/1997 | McClure et al. | 327/538 |
| 6,008,667 A | * | 12/1999 | Fahrenbruch | 326/66 |
| 6,011,428 A | | 1/2000 | Tsukude et al. | 327/540 |
| 6,046,624 A | | 4/2000 | Nam et al. | 327/530 |
| 6,100,769 A | * | 8/2000 | An et al. | 331/177 R |
| 6,316,987 B1 | * | 11/2001 | Dally et al. | 327/538 |

OTHER PUBLICATIONS

You, Fan et al., "An Improved Tail Current Source for Low Voltage Applications," IEEE Journal of Solid–State Circuits, vol. 32, No. 8, Aug. 1997, pp. 1173–1180.

von Kaenel, Vincent R., "A High–Speed, Low–Power Clock Generator for a Microprocessor Application," IEEE Journal of Solid–State Circuits, vol. 33, No. 11, Nov. 1998, pp. 1634–1639.

Garlepp, Bruno W. et al., "A Portable Digital DLL for High–Speed CMOS Interface Circuits," IEEE Journal of Solid–State Circuits, vol. 34, No. 5, May 1999, pp. 632–644.

Dally, William J. and John W. Poulton, "Digital Systems Engineering," Cambridge University Press, 1988, pp. 211–212, 590, 593–603.

* cited by examiner

*Primary Examiner*—Timothy P. Callahan
*Assistant Examiner*—Linh Nguyen
(74) *Attorney, Agent, or Firm*—Hamilton, Brook, Smith & Reynolds, P.C.

(57) ABSTRACT

The timing circuit includes at least one delay element and its supply voltage is obtained from an active current source. The current source is a current mirror which is driven by a differential amplifier. The differential amplifier compares a voltage on the delay element supply line to a voltage on a current control node connected to a voltage controlled current source. An RC compensating circuit may be coupled to the current control node.

35 Claims, 13 Drawing Sheets

LOW-POWER LOW-JITTER VARIABLE DELAY TIMING CIRCUIT

RELATED APPLICATIONS

This application is a continuation of application Ser. No. 09/453,368, filed Dec. 1, 1999, now U.S. Pat. No. 6,316,987, which claims the benefit of U.S. Provisional Application No. 60/160,950, filed on Oct. 22, 1999. The entire teachings of the above applications are incorporated herein by reference.

BACKGROUND OF THE INVENTION

Delay elements are used in a wide variety of digital timing circuits including ring oscillators, voltage-controlled oscillators, tapped delay lines, and clock buffers. These circuits are in turn used to provide timing signals to data communication circuits, microprocessors, and other digital systems. Depending on the application, delay elements may either have a fixed delay or a variable delay. The delay of a variable delay element is controlled by an input signal that may be either analog or digital. A good delay element is one that dissipates little power and has a very stable delay, exhibiting very low cycle-to-cycle delay variation or jitter in the presence of power-supply noise.

In the prior art, delay elements have been constructed from CMOS inverters, current-starved inverters, and source-coupled FET logic circuits. Such prior-art delay elements are described in Dally and Poulton, *Digital Systems Engineering*, Cambridge, 1998, pp. 589–603. FIG. 1 shows a prior art tapped delay line formed from a series of CMOS inverters 30. The input signal on the left is delayed to generated signals p1–p4 on the outputs of each inverter. By itself, this line provides a fixed delay. With the addition of a multiplexer to select one of the taps for output, it can provide a discrete variable delay. While CMOS inverter delay lines are simple, their delay is not well controlled. The delay varies with process, voltage, and temperature variations. Cycle-to-cycle variations in the supply voltage result in large cycle-to-cycle delay variations or jitter.

The current-starved delay element of FIG. 2 is an example of a prior-art voltage-controlled delay element. The input signal, in, is delayed by three inverters 32 to generate output, out. Each inverter has its supply and ground current limited by FETs 34 and 36 respectively, wired as current sources. The current, and hence the delay of the line is controlled by control voltage, vctrl. As vctrl is increased the current in each current source is increased allowing the inverters to switch more rapidly and hence reducing delay. The current-starved inverter delay line can be adjusted, by varying vctrl, to compensate for process, temperature, and average supply voltage variations. However, it still has high jitter because of its sensitivity to cycle-to-cycle power supply variations. Also, even with maximum voltage on vctrl, its speed is limited by the series connection of the current-source FETs with the inverters. This circuit is discussed in more detail in Dally and Poulton, pp. 211–212 and p. 590.

Most high-performance timing circuits built today use the source-coupled circuit shown in FIG. 3. A differential input, inP, inN, is delayed by three differential source-coupled stages 42 with PFET loads to generate differential output, outP, outN. This circuit has lower jitter than the CMOS inverter or current-starved inverter delay lines because its differential design rejects a portion of the power supply noise. However it dissipates considerably more power than the inverter-based delay lines and still has substantial jitter. Its power supply rejection is not perfect because the current source has a finite output impedance and the load resistors are non-linear. This circuit is described in more detail in Dally and Poulton, pp. 593–603.

Regulating the supply voltage as shown in FIG. 4 can reduce the jitter problem with CMOS inverter delay lines. Input voltage vctrl, through a voltage follower 50, controls the supply voltage to a series of CMOS inverters 52. Regulating the supply voltage with the voltage follower reduces power supply jitter, while the vctrl input allows voltage control over the delay of the line which may be used to adjust for fixed delay variations. This approach is described in more detail in Dally and Poulton, p. 593.

One can also regulate the current to the delay line as shown in FIG. 5. The control voltage, vctrl, generates a current that is mirrored using a cascoded current mirror circuit 60 to supply a constant current to the inverters 62 of a three-element inverter delay line. This approach is described in von Kaenel, "A Low-Power Clock Generator for a Microprocessor Application, " *Journal of Solid-State Circuits,* 33 (11), pp. 1634–9.

SUMMARY OF THE INVENTION

The present invention overcomes the limitations of prior-art delay elements by offering the low-power of a CMOS inverter delay element with significantly lower jitter than previous approaches using current-starved inverters, cascoded current sources, or voltage followers.

Previous approaches to regulating the current or voltage to a CMOS delay line suffer from poor bandwidth of the regulating circuits. Thus, while the circuits cancel DC and low-frequency variations in the power supply voltage, high-frequency supply variations still cause significant jitter in the delay of the element. Because of limited bandwidth, a typical voltage follower rejects supply noise only up to a few tens of MHZ. A current-regulator, while it has a high DC output impedance, has a low AC impedance due to gate overlap capacitances. This low AC impedance couples high-frequency supply noise directly onto the supply of the CMOS inverters, causing high-frequency jitter. The cascoded current source also requires significant voltage headroom (a voltage drop from the positive supply Vdd to the inverter supply voltage), preventing its use in high-speed, low-voltage applications.

In accordance with the present invention, a timing circuit comprises a delay element and a current source circuit. A current source maintains a specified current through its terminals, no matter what the voltage across the terminals. To maintain a constant current with varying terminal voltage, the current source requires a high output impedance. The current source circuit, which includes a differential amplifier, supplies current to the delay elements through a supply node. The differential amplifier compares the voltage on the supply node to a voltage on a current control node to control the supplied current.

The preferred delay element is a differential CMOS inverter.

The preferred current source circuit comprises a first transistor that sources reference current and a second transistor that supplies current to the delay elements. The differential amplifier holds terminals of the first and second transistors at substantially the same voltage. Preferably, the differential amplifier is an operational amplifier which has a wide output voltage swing.

The preferred current source circuit comprises a controlled current source, a first transistor in series with the controlled current source and a second transistor supplying the current to the delay element. The current control node is between the first transistor and the current source, and the differential amplifier drives the gates of the first and second transistors. An RC compensating circuit may be coupled to the current control node.

In one application, the timing circuit further comprises a voltage regulator in combination with the current source circuit. The voltage regulator compares a voltage applied to the delay element with a reference voltage to control a current set point applied to the current source circuit.

Other applications include a voltage control oscillator, a phase-locked loop, a delay-locked loop and a clock buffer.

DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

The preferred embodiment of the present invention uses a voltage-controlled differential CMOS inverter delay element with its supply voltage controlled by a high-bandwidth regulator to achieve low-power and low jitter.

Delay Line With Voltage-Controlled Differential Delay Elements

Figure 6:
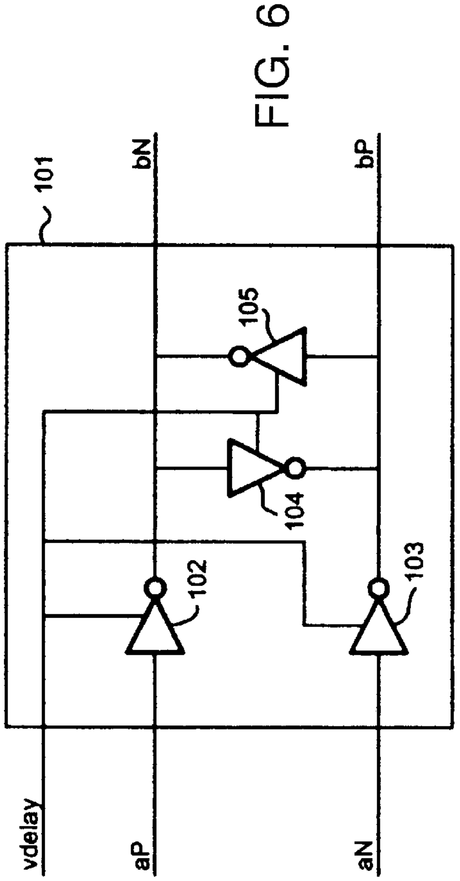
FIG. 6 is a logic circuit diagram of a delay element used in preferred embodiments of the present invention.

A voltage-controlled differential CMOS inverter delay element 101 is shown in FIG. 6. Differential inputs aP and aN are input to inverters 102 and 103. The inverters generate outputs bP and bN with delay controlled by input vdelay. Cross-coupled inverters 104 and 105 act to keep outputs bP and bN complementary. This cross coupling reduces skew between the complementary outputs due to skew in the inputs, variations in delay between inverters 104 and 105, or duty factor variation by slowing the fast output, and speeding the slow output. The cross-coupled inverters also have their supply terminal connected to vdelay to keep the voltage swing on outputs bP and bN between ground and vdelay.

Figure 7:
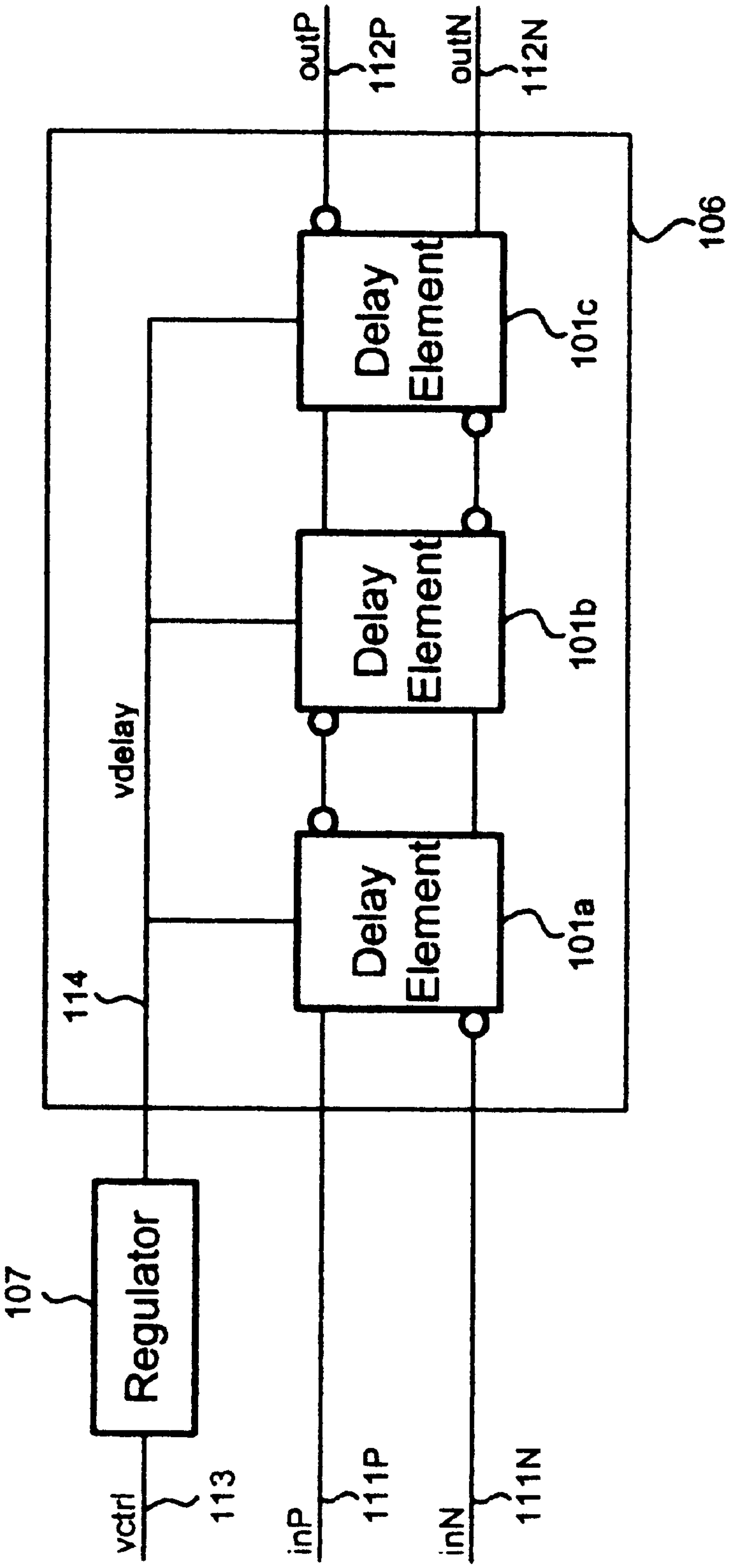
FIG. 7 is a block diagram of a delay line with an active current source embodying the present invention.

A voltage-controlled delay line 106 using three such delay elements 101_a–c_ is illustrated in FIG. 7. Control voltage vctrl 113 is input to regulator 107 which generates inverter supply voltage vdelay 114. This voltage controls the delay of voltage-controlled differential CMOS inverter delay elements 101_a–c_.

Differential delay elements similar to these have previously been used in fixed-delay tapped delay lines. An example of such an application is described in Garlepp et al., "A Portable Digital DLL for High-Speed CMOS Interface Circuits," _IEEE Journal of Solid-State Circuits,_ 34 (5), pp. 632–644.

Active Current Regulator

The present invention overcomes the bandwidth and headroom limitations of prior art current-controlled delay lines by using an active current source. As illustrated in FIG. 7, the present invention uses a regulator circuit 107 to generate the supply voltage for a delay line 106 consisting of several voltage-controlled differential CMOS inverter delay elements 101_a–c_. The details of the regulator for one preferred embodiment of the invention are shown in FIG. 8.

Figure 8:
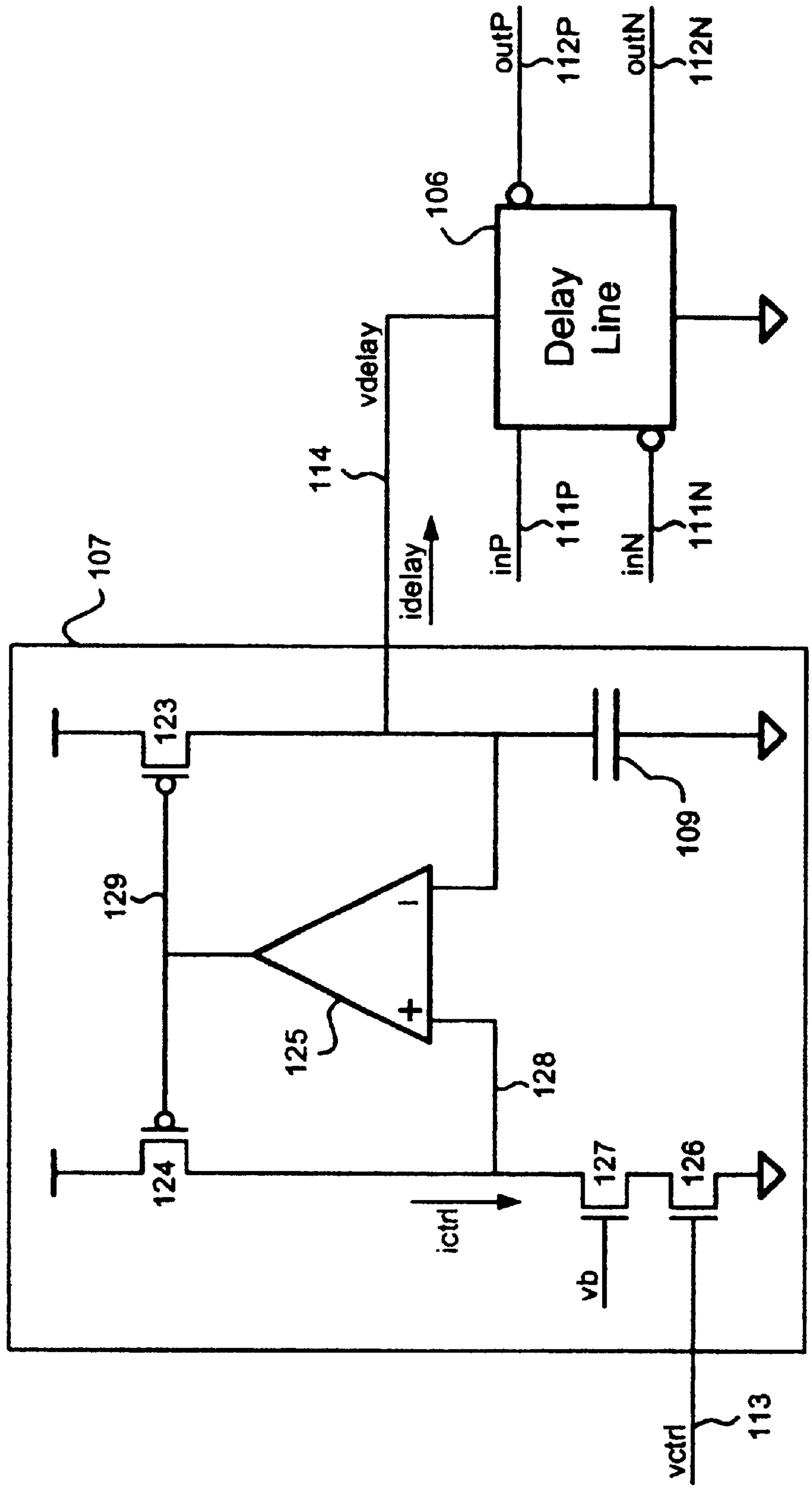
FIG. 8 provides an electrical schematic diagram of the regulator of FIG. 7.

As shown in FIG. 8, control voltage vctrl is translated to a current, ictrl, by the cascoded current source formed by FETs 126 and 127. FET 126 is operated in the saturated current region to serve as a current source, the current being determined by the gate voltage vctrl. FET 127 increases the output impedance of the current source by a factor of the transconductance of FET 126. The cascoded current source has very high output impedance (typically over 1 megaOhm), making current ictrl insensitive to variations in the supply voltage. Current ictrl is then mirrored by the active current mirror formed by PFETs 123 and 124 and Op-amp 125 to generate delay element supply current idelay. The current mirror is typically ratioted so that idelay is a multiple of ictrl. In the preferred embodiment, idelay is ten times ictrl.

Op-amp 125 and PFET 124 form a negative feedback loop that holds node 128, the drain voltage of PFET 124 and the positive input of the Op-amp, at the same voltage as vdelay on node 114. With identical gate, source, and drain voltages, PFETs 123 and 124 generate currents that are proportional to their relative widths. With PFET 123 sized ten times wider than PFET 124, idelay will be precisely ten times ictrl.

Figure 5:
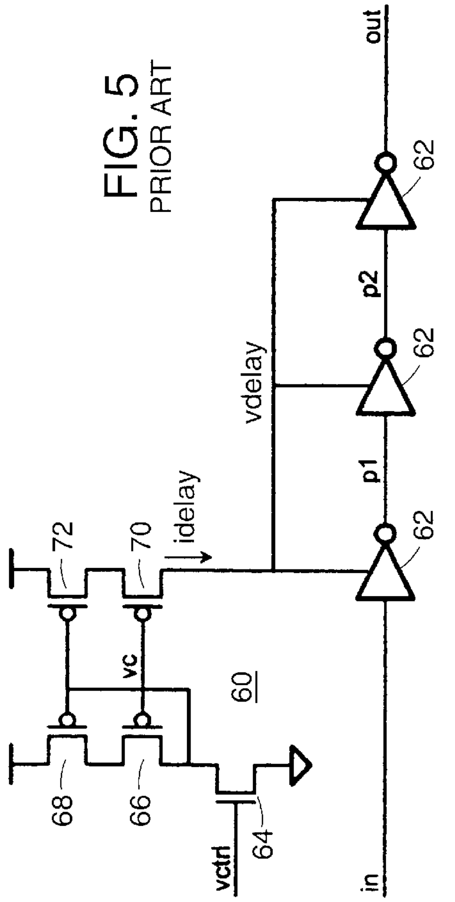
FIG. 5 PRIOR ART
FIG. 5 illustrates a prior art delay line using a cascoded current mirror circuit to supply current to the delay line.

Compare operation of the circuit of FIG. 8 to that of FIG. 5 in both steady state and with fluctuations in supply voltage. In the circuit of FIG. 5, FET 64 sources a current determined by the control voltage vctrl. The source to gate voltages of FETs 66 and 68 reach a level which maintains that fixed current through FET 64. The gate voltage applied to FETs 66 and 68 is also applied to FETs 70 and 72. With the same source to gate voltages applied across FETs 70 and 72 as across FETs 66 and 68, the current through FETs 70 and 72 is determined by the impedances of the inverter circuits 62 but will be proportional to the control vctrl. With a change in supply voltage applied to the sources of transistors 68 and 72, a portion of that change in voltage is promptly seen at vdelay. The gate voltage to the FETs will change in order to maintain the constant current through FET 64. That correction in gate voltage does correct the current idelay over a time constant to correct the voltage vdelay, but the correction will not be exact due to the impedance differences between the inverter circuit 62 and the FET 64.

By contrast, the circuit of FIG. 8 assures not only that the source and gate voltages of FETs 123 and 124 are the same, but that the drain voltages are the same. Any difference in drain voltages results in an imbalance to the inputs to amplifier 125 and a correction to the gate voltage 129. As a result, the current mirrored through FET 123 is dependent only on its width relative to that of FET 124 and is independent of the impedance of the delay line. With change in the supply voltage, a change in voltage will be promptly seen at vdelay. The change in voltage will be substantially less than that seen in the circuit of FIG. 5, however, due to a difference in capacitance ratios which may be obtained with the present circuit as discussed below. Further, since the node 128 is in a relatively low capacitance circuit, the voltage on node 128 responds rapidly to an increase in supply voltage with an increase in the voltage on node 128 relative to vdelay on node 114. Amplifier 125 responds by increasing the gate voltage 129 and reducing current through FET 123. The active feedback circuit promptly drives the gate voltage 129 to a level which maintains equal drain voltages and the original current through FET 123 which corresponds to the constant current through FETs 126, 127 determined by vctrl.

This circuit has several advantages over the prior-art circuit of FIG. 5: it is physically smaller, has smaller AC feed-through of power supply noise, higher-bandwidth rejection of power supply noise, higher DC output impedance, and can be operated with very little headroom.

The first two advantages stem from the fact that supply PFET 123 can be made significantly smaller than the current source PFETs of circuit 60 of FIG. 5 for two reasons. First, because the gain of OpAmp 125 ensures a high DC output impedance, PFET 123 can be made minimum length while the PFETs in FIG. 5 must be made long to avoid channel-length modulation and cascoded. Second PFET 123 can be operated in the triode region with its gate near ground while the current source PFETs in FIG. 5 must be operated in the saturation region, where a much larger FET is required to carry the same current. The smaller PFET has less overlap capacitance and hence couples less AC supply noise onto the delay element supply line, vdelay 114.

The active current source of FIG. 8 has much higher bandwidth than the passive cascoded current source of FIG. 5. The passive current source has a time constant that depends on the capacitance on the delay element supply and the effective resistance across this supply. Typically this time constant is on the order of 20 ns or more, giving a bandwidth of about 10 MHz. The active circuit, on the other hand, has a time constant that depends on the bandwidth of the internal feedback loop from the output of OpAmp 125 to PFET 124, back to node 128 on the input of OpAmp 125. For a typical process this bandwidth is on the order of 1 GHz. Hence the active circuit is able to reject significant noise in the band from 10 MHz to 1 GHz that the passive circuit is not able to reject.

The higher DC impedance of FIG. 8 stems from the fact that the impedance is multiplied by the gain of the internal feedback loop. By using an amplifier with a high DC gain, the output impedance, which relates to the DC power supply rejection, can be made much higher than the impedance of the cascoded current source of FIG. 5.

Finally, the low headroom of FIG. 8 is due to the fact that PFET 123 can be operated in the triode region with as little as 100 mV or less of voltage drop from Vdd (the positive supply) to vdelay, the delay element supply. The cascoded current source, on the other hand, requires 700 mV or more of headroom (drop from Vdd to vdelay) to operate with high output impedance.

Figure 9:
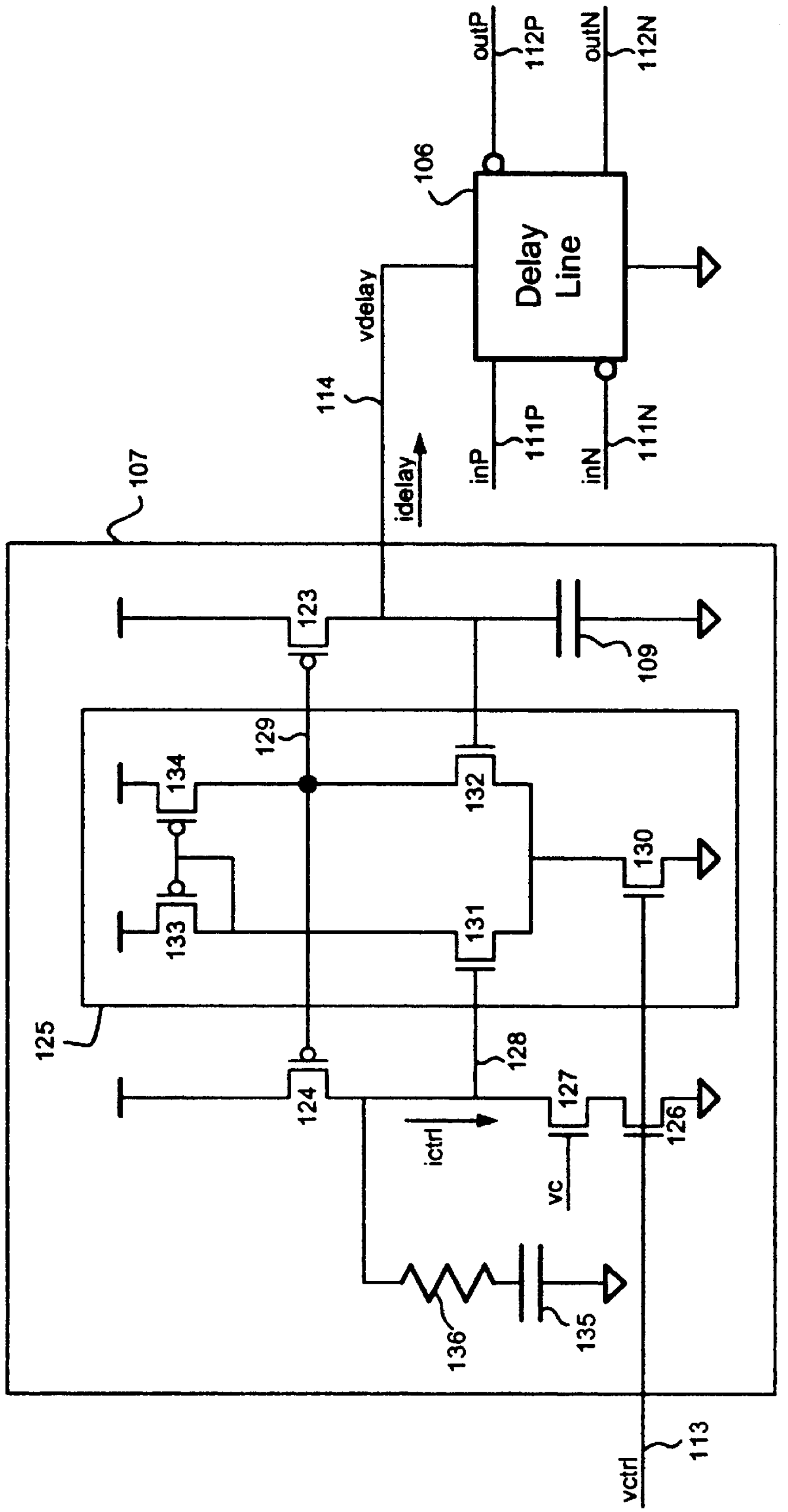
FIG. 9 provides a more detailed electrical schematic of the regulator of FIGS. 7 and 8.

The active current source employed in the regulator of FIGS. 8 and 9 is adapted from an active current source employed to supply the tail current of amplifiers described in Fan You et al., "An Improved Tail Current Source for Low-Voltage Applications," *IEEE Journal of Solid-State Circuits,* 32 (8), pp. 1173–80. We have made three key improvements to the circuit described in this reference. The first is adapting it to be used to regulate the current for a delay element rather than to supply tail current to an amplifier. The second is to add a compensating network that significantly increases the bandwidth of this circuit in the current regulator application. Finally, we modify the OpAmp to have a full-swing output in FIG. 11, enabling the size of PFET 123 to be further reduced. That modification is described below with respect to FIG. 12.

Detailed Circuit Design of Active Current Regulator

FIG. 9 shows a detailed circuit diagram of one embodiment of the active current source regulator of FIG. 8. Op-amp 125 is realized by a source-coupled NFET pair 131 and 132 with a NFET current source 130 providing tail current. PFET current mirror 133 and 134 provide the Op-amp's load.

In conventional practice, this circuit would be compensated to avoid an unstable 180° phase at unity gain by placing a series RC circuit on Op-amp output 129 as was done in the above mentioned reference. In the current regulator application, however, compensating the circuit in this manner would result in the need for a very large compensating capacitor and low regulator bandwidth.

Because the regulator current mirror is ratioed, idelay is ten times ictrl, there is considerable difference in the capacitance of the nodes of the circuit of FIG. 9. In the preferred embodiment, bypass capacitor 109 gives node vdelay 114 a capacitance of 10 pF, and the large PFET 123 gives node 129 a capacitance of 400 fF, while small PFET 124 and NFET 131 result in a capacitance of only 10fF on node 128.

Placing the series RC compensating network on low capacitance node 128 rather than on high-capacitance Op-amp output 129 realizes two significant advantages. First, compensating capacitor 135 need be only 1/40 the size that would be required to compensate node 129. In the preferred embodiment, a 50 fF capacitor can be employed compared with a 2 pF capacitor on node 129. Second, by placing this compensation circuit only in the feedback loop formed by amplifier 125 and PFET 124, and not in the loop formed by amplifier 125 and PFET 123, loop bandwidth is increased.

Figure 10A:
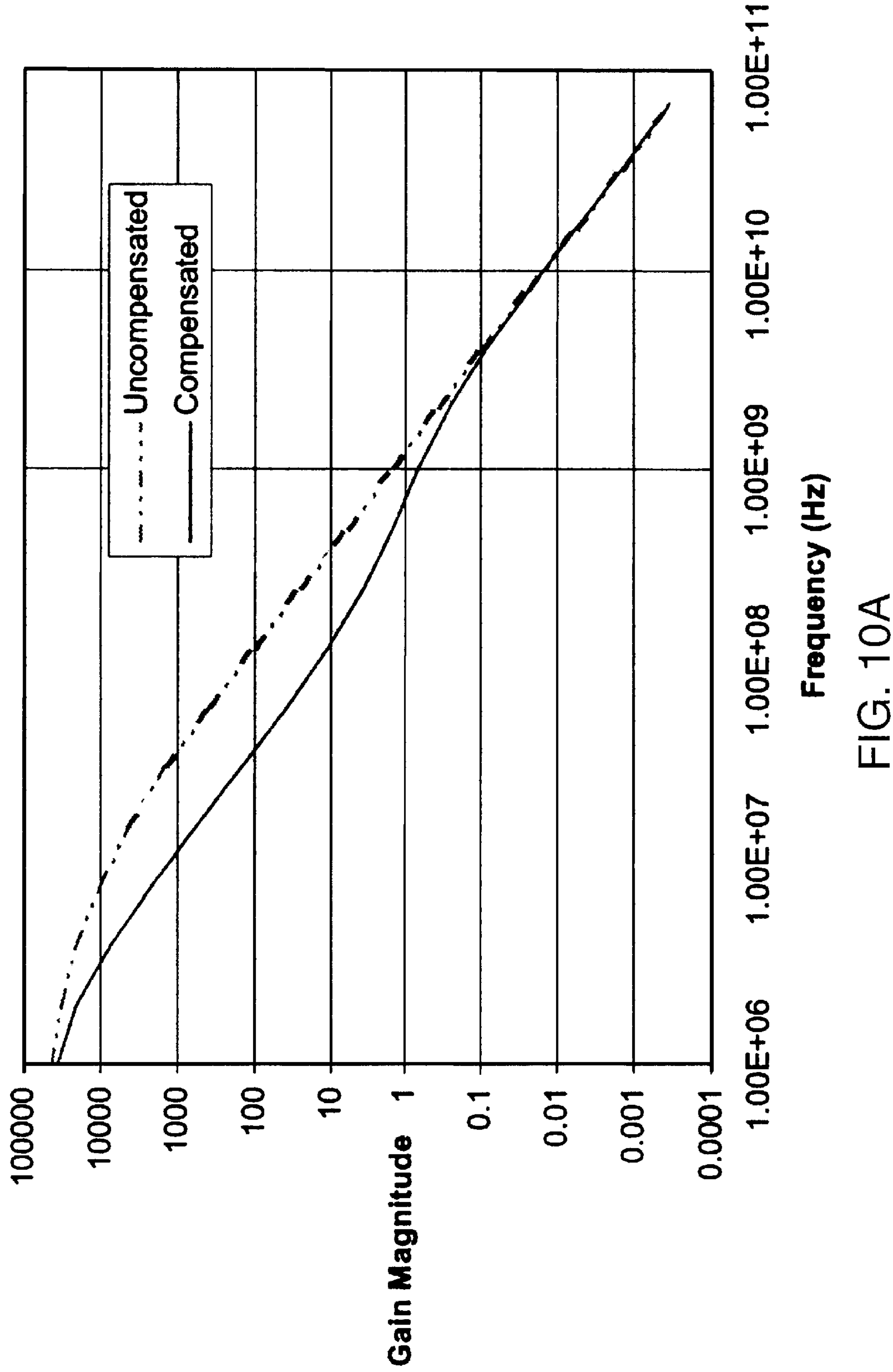
FIGS. 10A and 10B illustrate gain magnitude and phase versus frequency for the circuit of the FIGS. 8 and 9 with and without compensation.
Figure 10B:
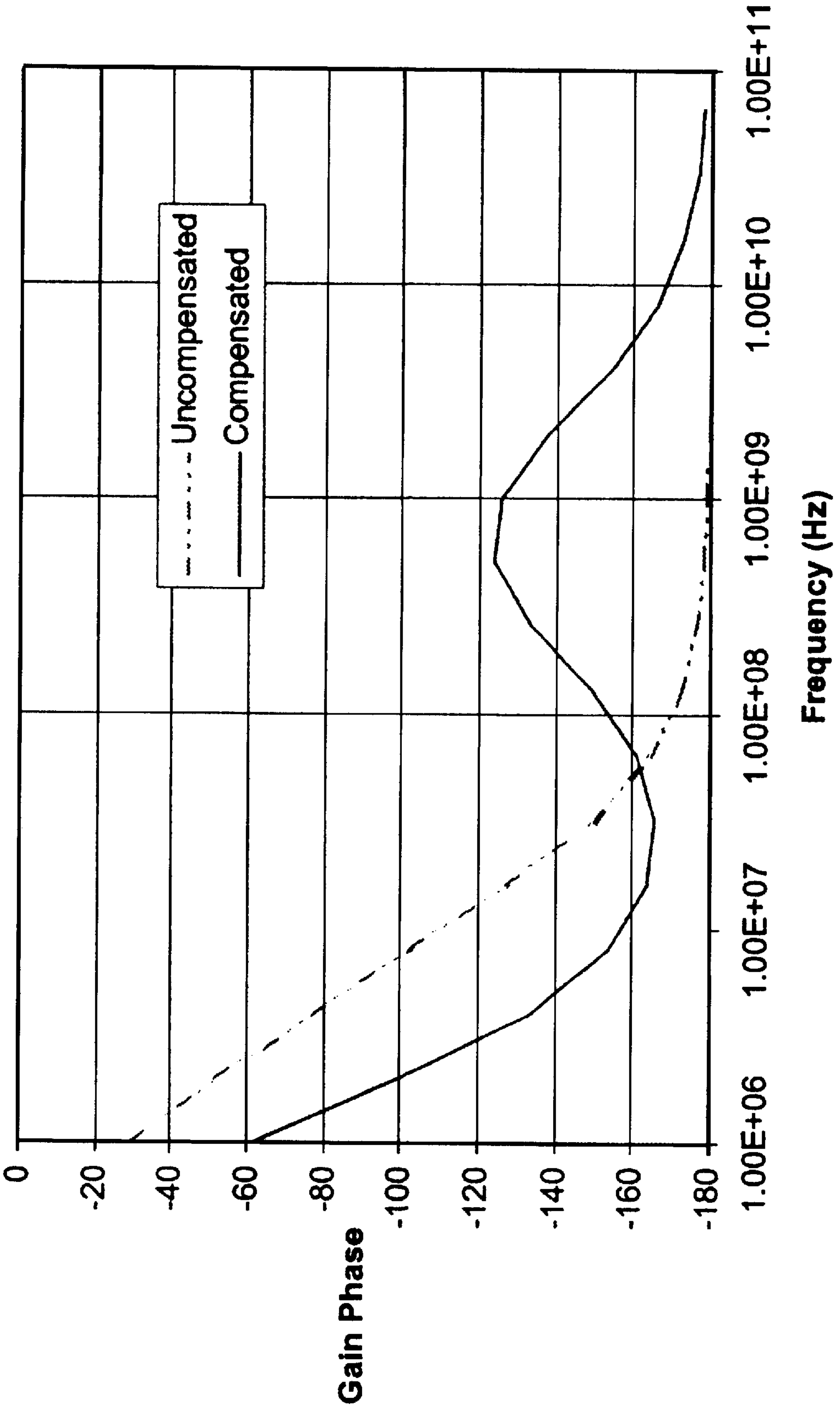

FIGS. 10A and 10B show the frequency response of the active current regulator of FIGS. 8 and 9. The figures show both the response without compensating RC network 135 and 136 (dashed line) and with the compensating network (solid line). The plots show that without compensation, the negative feedback loop has a unity gain frequency of 1 GHz but is unstable, its phase is 180-degrees at the unity-gain frequency. Adding the compensation network reduces the unity gain frequency to about 500 MHz but gives 55 degrees of phase margin at unity gain making the circuit stable.

Figure 11:
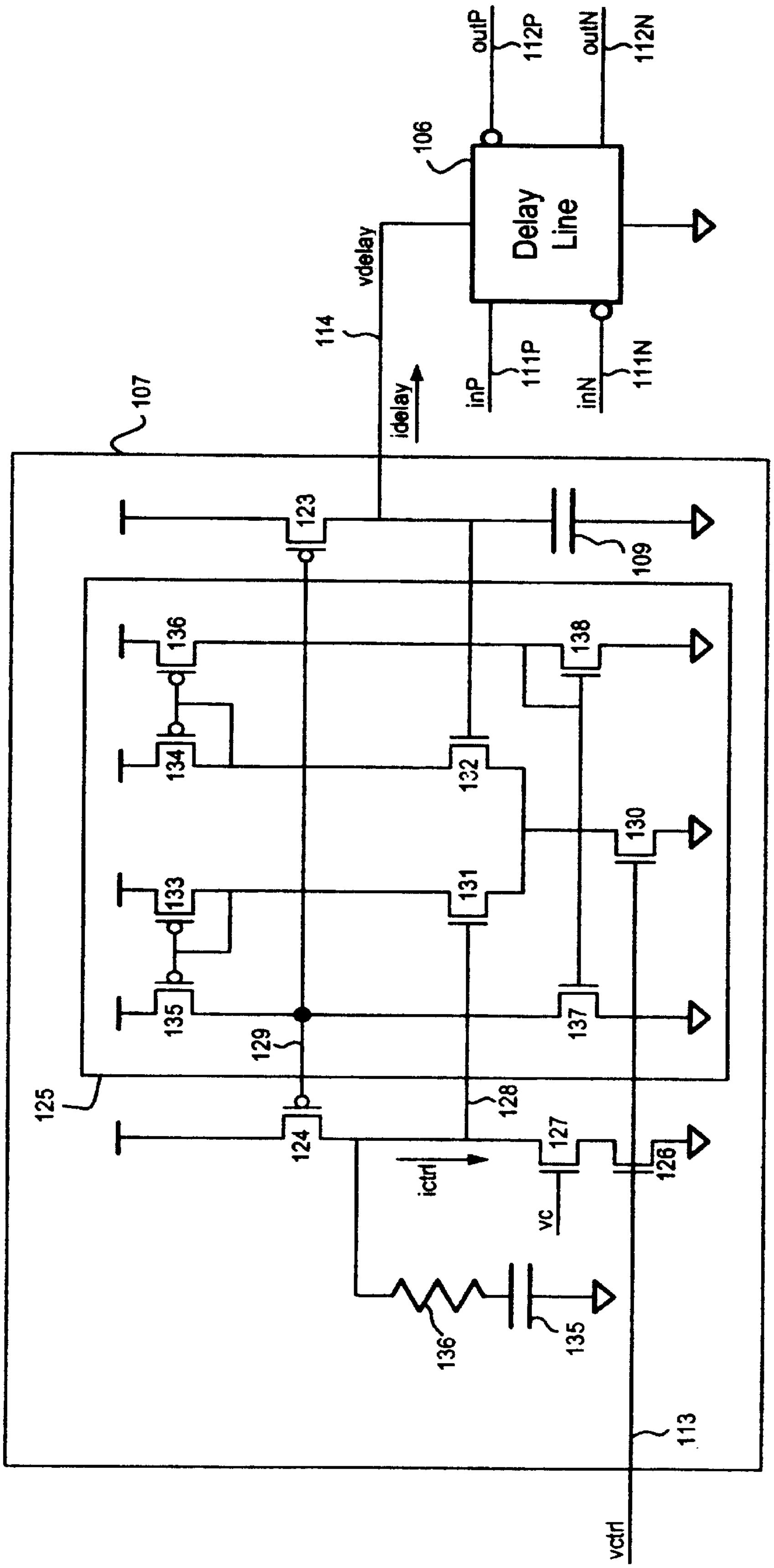
FIG. 11 illustrates an alternative embodiment of the current regulator modified for full swing output.

FIG. 11 shows the circuit diagram of another embodiment of the present invention. In this figure, OpAmp 125 has been modified to have a fall-swing output. Input pair 131 and 132 generate a differential current proportional to the input voltage difference. The current in the left branch is mirrored by PFET current mirror 133 and 135 and the current in the right branch is mirrored by PFET current mirror 134 and 136. This right branch current is then mirrored again by NFET current mirror 138 and 137. The net effect is that PFET 135 sources a current proportional to the left branch current from NFET 131 while NFET 137 sinks a current proportional to the right branch current from NFET 132. The output node 129 thus swings to a voltage proportional to this current difference multiplied by the parallel output impedance of FET current sources 135 and 137.

The advantage of this circuit is that output node 129 can swing rail-to-rail from GND to Vdd. In contrast, in FIG. 9, the OpAmp output, 129, cannot drop more than a threshold voltage below vdelay 114, or NFET 123 will drop out of saturation and the gain of the OpAmp will be dramatically reduced.

Constant-Current Voltage Regulator

Figure 1:
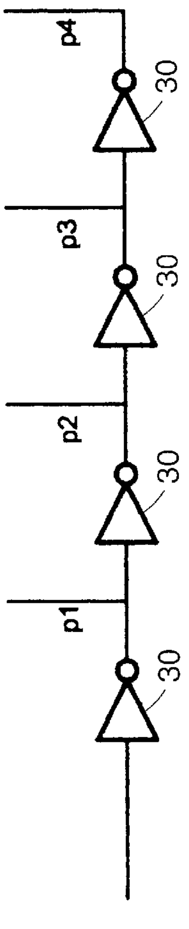
FIG. 1 PRIOR ART
FIG. 1 illustrates a prior art delay line.
Figure 2:
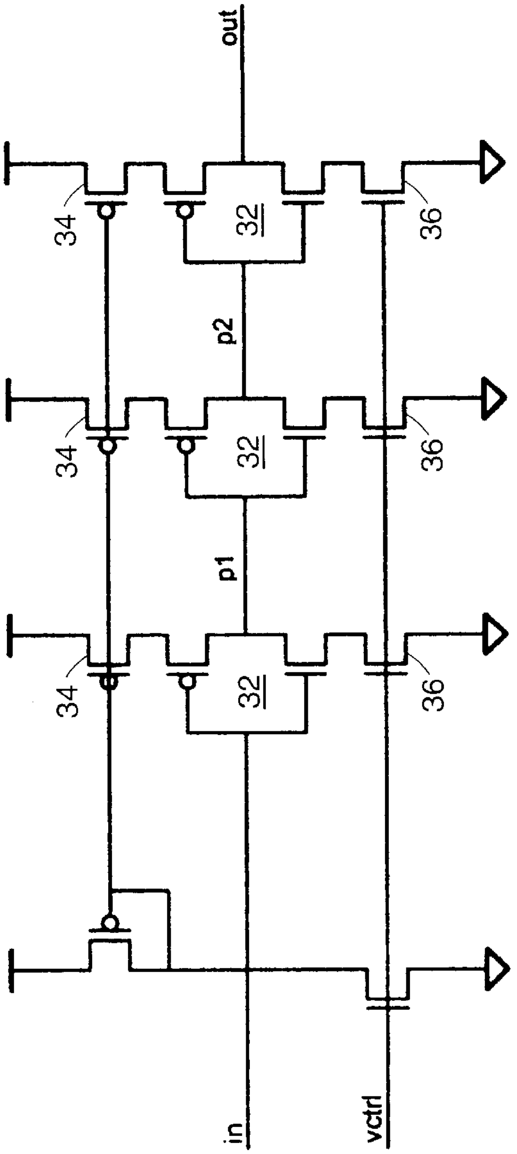
FIG. 2 PRIOR ART
FIG. 2 illustrates a prior art voltage control delay element.
Figure 3:
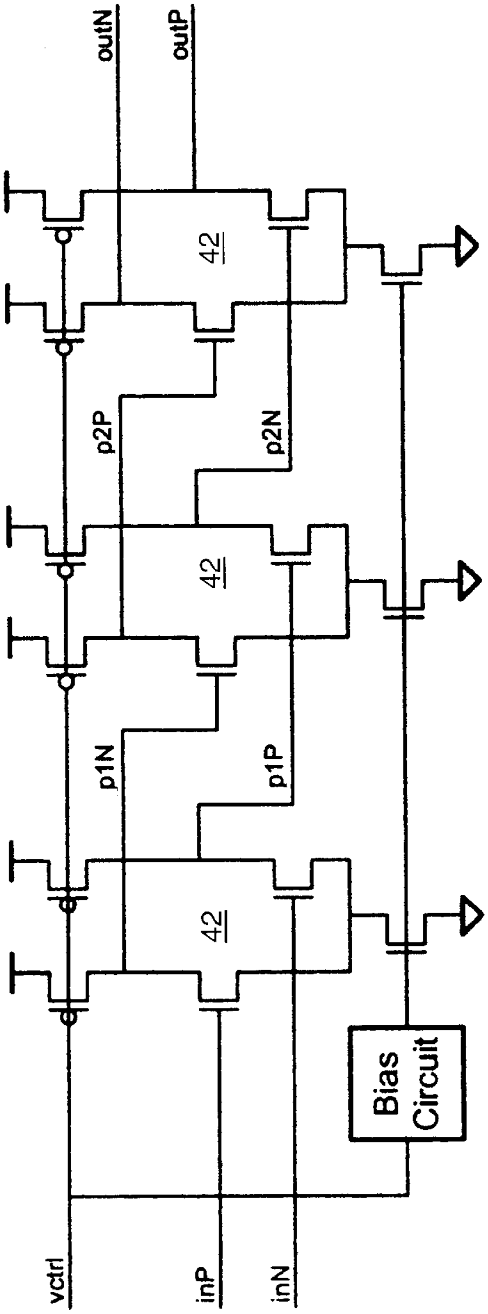
FIG. 3 PRIOR ART
FIG. 3 illustrates a prior art delay line using source coupled circuits.
Figure 4:
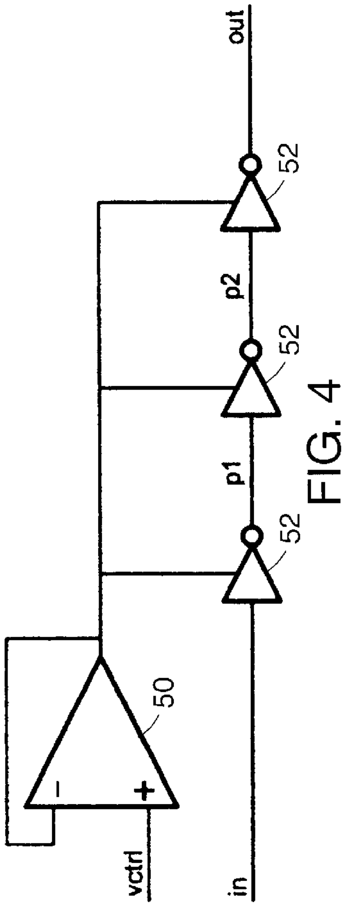
FIG. 4 PRIOR ART
FIG. 4 illustrates a prior art delay line using a voltage follower or supply voltage regulator.

In many applications, such as clock buffers, it is desirable to run the buffer or delay element from as high a supply voltage as possible, to minimize overall delay, while at the same time isolating the supply voltage of the buffer from power supply noise. Using a conventional voltage follower, such as shown in FIG. 4 for this application results in poor high-frequency supply rejection as the time constant of the voltage follower is set by the large capacitance on the buffer supply node.

Figure 12:
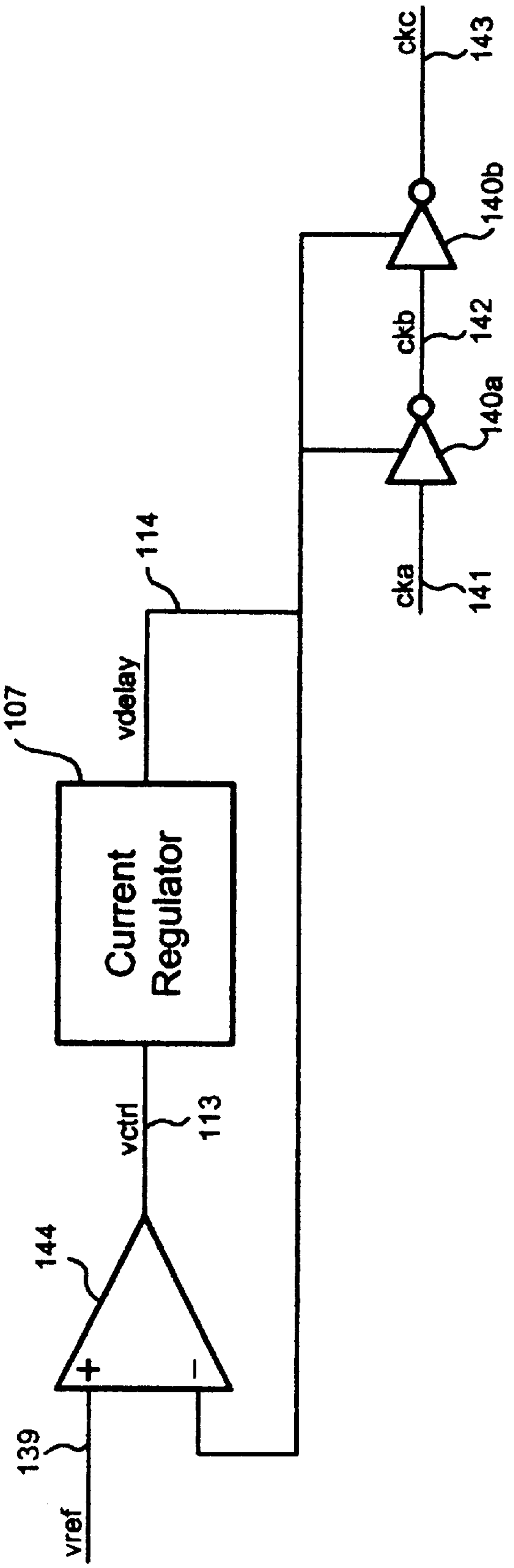
FIG. 12 illustrates another embodiment of the invention including a voltage regulator and a current regulator.

A clock-buffer voltage regulator with very good high-frequency response can be realized by closing a slow voltage regulation loop around the active current regulator of FIGS. 8–11 as illustrated in FIG. 12. This circuit takes advantage of the fact that a clock buffer draws a constant current at frequencies of interest, and thus supplying constant current to the clock buffer ensures that it will operate from a constant voltage, and hence have a constant delay.

The circuit of FIG. 12 uses OpAmp 144 to set vctrl on node 113 at a level that in the steady-state drives vdelay on node 114 to the same value as reference voltage vref on node 139. The voltage loop is made slow compared to the internal loop of the current regulator to keep the overall system stable.

Once the proper operating current for the delay element is established by the outer, voltage, loop, the current regulator acts to hold this current constant in the presence of power supply noise. The high bandwidth and high output impedance of the current regulator circuit act to give a clock buffer with very low jitter.

Comparison of Delay-Element Dynamics

Figure 13:
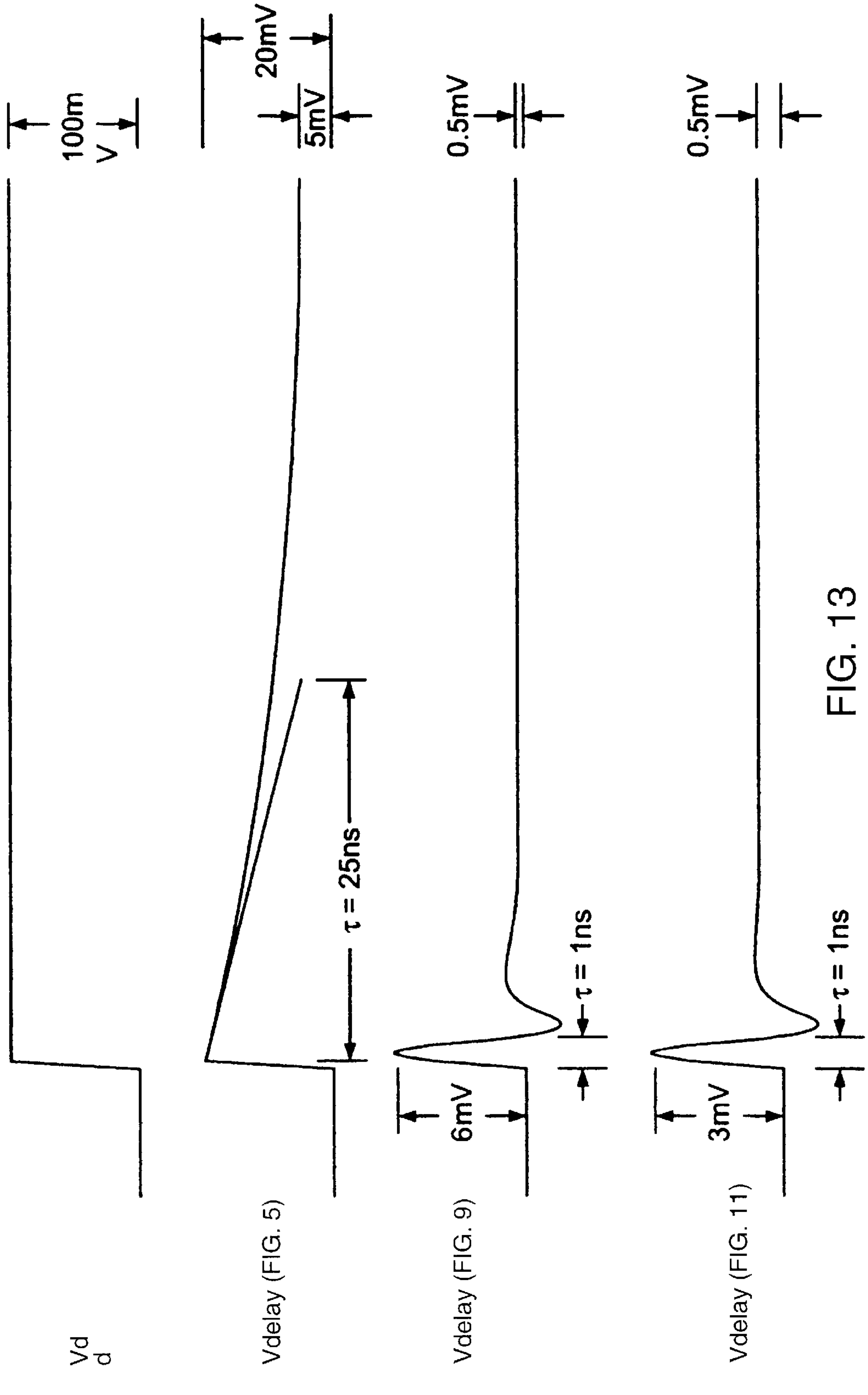
FIG. 13 illustrates the response to a change in the supply voltage by each of the circuits of FIGS. 5, 9 and 11.

The waveforms of FIG. 13 illustrate the advantage of the present invention by comparing the response of three current regulators to a 100 mV step disturbance on the power supply. The four traces share a single horizontal time scale showing 70 ns of activity. Each trace has a different vertical scale. The top trace shows the power supply, Vdd changing by 100 mV near the beginning of the interval. The lower three traces show the response of the vdelay node for three different current regulators. In each case, the area under the curve corresponds to the total variation in delay or jitter.

The second trace shows the response of the delay element supply node, vdelay, for the prior-art current regulator of FIG. 5. Because of the large feed-through capacitance of this circuit, vdelay initially jumps 20 mV. The magnitude of this jump is set by the ratio of the feed-through capacitance, $C_f$, and the capacitance of vdelay, $C_d$. A 20 mV response to a 100 mV disturbance corresponds to a capacitance ratio of 4:1. One can reduce the magnitude of the disturbance by increasing $C_d$, but at the expense of lengthening the duration of the disturbance. The initial 20 mV disturbance decays with a time constant of 25 ns to a steady-state disturbance of 5 mV. The time constant is set by the effective supply resistance of the delay elements, $R_d$, and $C_d$. For the system of the preferred embodiment $R_d$ is 2.5 kOhms and $C_d$ is 10 pF giving a time constant of 25 ns. The steady-state disturbance is determined by the ratio of the current-source output impedance and $R_d$. Here the 5% steady-state error corresponds to an impedance ratio of 19:1, or a current source with an output impedance of about 500kOhms.

The third trace shows the response of the vdelay node for the current regulator of FIG. 9. Note that this is on a different vertical scale than the other three traces. Here the initial response has a magnitude of only 6 mV and decays within 1 ns to a steady-state error of 0.5 mV. The smaller initial response is due to the smaller feed-through capacitance of PFET 123, giving a capacitance ratio of about 15:1. The more rapid decay is due to the high bandwidth of the internal feedback loop of the active current regulator. The small, 0.5% steady-state error corresponds to an impedance ratio of 199:1, or an output impedance of about 5 MOhms. This high output impedance with low feed-through capacitance is achieved by the high-gain of the OpAmp in the active current regulator.

The fourth trace in FIG. 13 shows the response of the vdelay node for the current regulator of FIG. 11. This trace is similar to the response of the circuit of FIG. 9 except that the initial disturbance is reduced to 3 mV. This is due to PFET 123 being sized smaller because it is able to operate with a lower gate voltage, hence the capacitance ratio is increased to about 30:1.

These traces show graphically that by reducing the voltage disturbance of the delay elements by a factor of 7 in amplitude and a factor of 25 in time, the circuit of FIG. 11 reduces the integrated delay error, and hence jitter, by a factor of 175 compared to the prior art circuit of FIG. 5.

Application of Delay Elements to Clock Buffers PLLs and DLLs

The low-power, low-jitter delay elements described above can be used in a variety of applications involving both fixed-delay and variable delay. FIG. 12 illustrates a fixed-delay application as a clock buffer. Here inverters **140*a* and 140*b* form a clock buffer. These inverters have a very stable delay because their voltage supply, vdelay on node 114, is generated by an active current regulator 107 of the type illustrated in FIGS. 8 to 11**.

Figure 14:
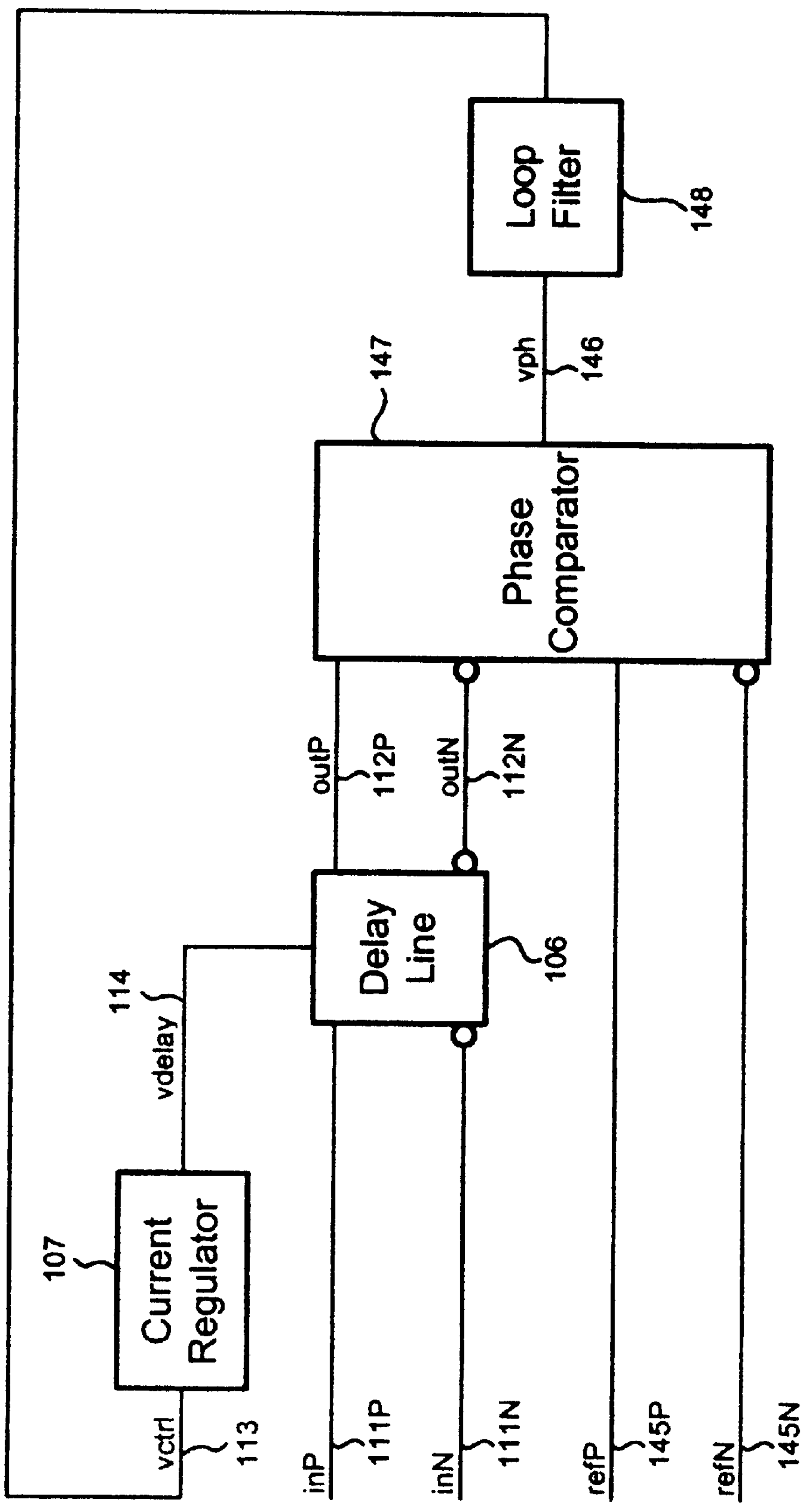
FIG. 14 illustrates the current regulated delay line in a delay-locked loop.

FIG. 14 shows an application of the delay elements of the present invention to a delay-locked loop (DLL). Input clock inP, inN is input to a delay element that is stabilized by a current regulator 107. The output of the delay element, outP, outN, is compared to a reference clock, refP, refN, by phase comparator 147. The phase comparator generates a voltage, vph on node 146, proportional to the phase difference between the delay line output and the reference clock. This voltage is filtered by loop filter 148 to generate vctrl on line 113, the control voltage used to set the current level for the delay element. This feedback loop acts to adjust the current, and hence the delay, of the delay element so that the delay element output is aligned with the reference clock. Current regulator 107 acts to isolate delay line 106 from variations in the power supply, giving a DLL with very low jitter.

The high-bandwidth of the current regulator of the present invention 107 is of great advantage in feedback circuits such as the DLL of FIG. 14. The current regulator responds to changes in its control voltage, vctrl, with a time constant set by its internal control loop, about 1 ns in the preferred embodiment. In contrast, prior art current-regulated delay elements respond much slower, with a time constant of 20 ns or more. The fast time constant of the present invention allows the current regulator to be inserted into a high-bandwidth feedback loop, as in FIG. 14, without destabilizing the loop.

Figure 15:
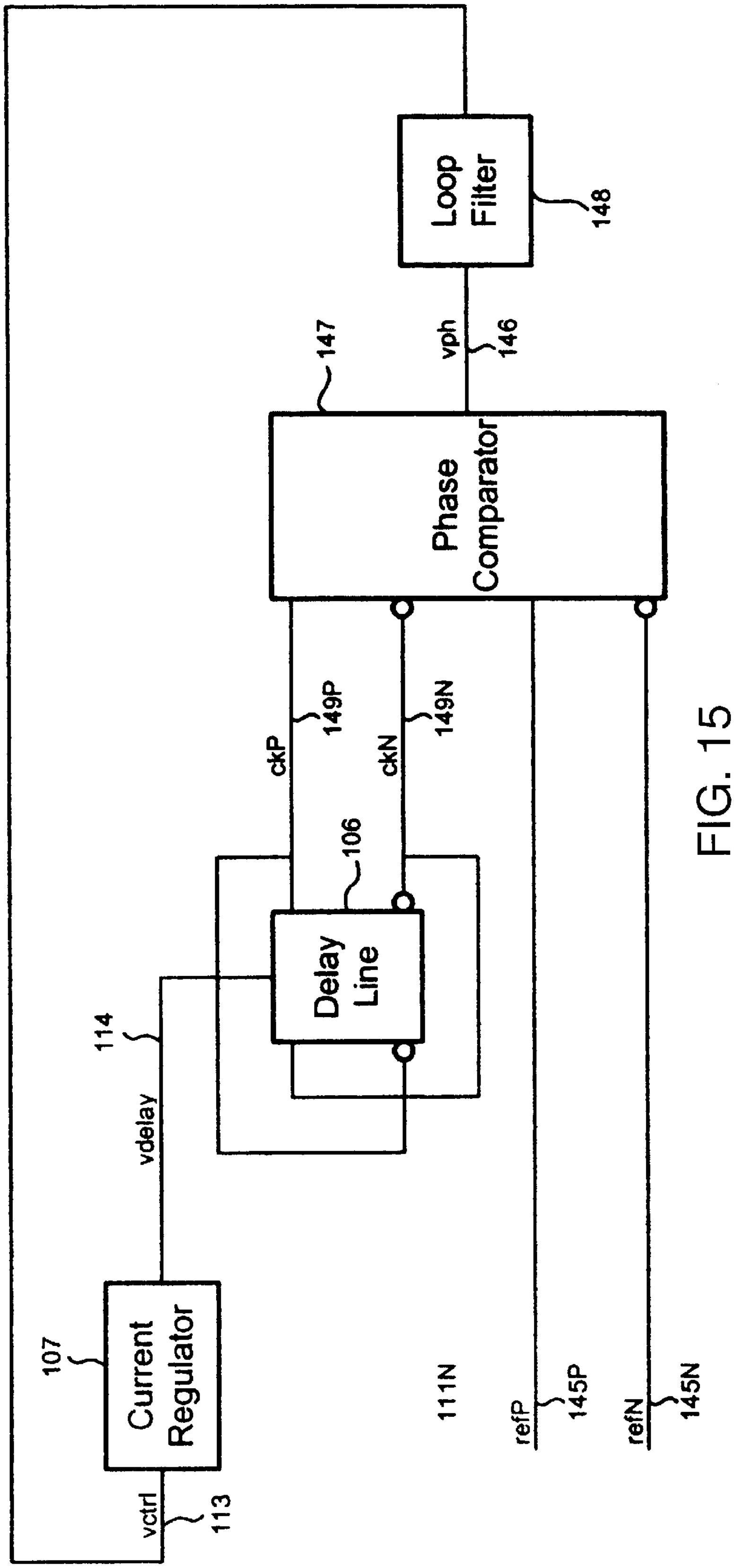
FIG. 15 illustrates the current regulated delay line connected as a voltage-controlled oscillator in a phase-lock loop.

FIG. 15 shows an application of the present invention to a phase-locked loop (PLL). Delay line 106 is connected as a voltage-controlled ring oscillator with its output tied to its input with the polarities reversed. The voltage-controlled oscillator (VCO) generates a frequency on the clock lines, ckP, ckN, that is a function of the regulator output voltage, vdelay 114. This in turn is a function of the control voltage, vctrl 113. The clock output of the VCO, 149, is compared to a reference clock by a phase comparator 147 and the resulting voltage, vph on node 146, is filtered by loop filter 148 to generate the control voltage 114. Just as with the delay-locked loop, the use of the active current regulator of the present invention has two significant advantages when applied to a phase-locked loop. First, the regulator isolates the VCL, delay line 106, from power supply variations resulting in a very low jitter PLL. Second, the high-bandwidth of the current regulator from its vctrl input to its vdelay output allows the regulator to be inserted into feedback loops, as in the PLL, without destabilizing the loop.

One skilled in the art of timing circuit design will understand that many variations of the present invention are possible. Differential amplifier circuits may be used in the active current regulator. Different compensation networks may be used to stabilize the regulator circuit. Different differential or single-ended delay elements or buffers may be used. In the DLL and PLL circuits, a combined phase comparator/charge pump circuit, as described in pending patent application U.S. Application Ser. No. 09/414,761, filed Oct. 7, 1999 by William J. Dally, Ramin Farjad-Rad, Teva J. Stone, Xiaoying Yu and John W. Poulton, for "Combined Phase Comparator and Charge Pump Circuit," may be used in place of the phase comparator and loop filter. Also, in the PLL application, a divide by N counter may be used on either or both inputs to the phase comparator to give a PLL that performs frequency multiplication and division or both.

While this invention has been particularly shown and described with references to preferred embodiments thereof, it will be understood by those skilled in the art that various changes in form and details may be made therein without departing from the scope of the invention encompassed by the appended claims.

What is claimed is:

1. A timing circuit comprising:

a delay element; and a current source circuit supplying current to the delay element through a supply node, the current source circuit including a differential amplifier which compares the voltage on the supply node to a voltage on a current control node to control the supplied current.

2. A timing circuit as claimed in claim 1 wherein the delay element includes a CMOS inverter.

3. A timing circuit as claimed in claim 1 wherein the delay element is a differential CMOS inverter.

4. A timing circuit as claimed in claim 1 wherein the current source circuit comprises a first transistor that sources reference current, and a second transistor that supplies current to the delay element, the differential amplifier holding terminals of the first and second transistors at substantially the same voltage.

5. A timing circuit as claimed in claim 4 wherein the differential amplifier is an operational amplifier.

6. A timing circuit as claimed in claim 5 wherein the operational amplifier has a wide output voltage swing.

7. A timing circuit as claimed in claim 1 further comprising an RC compensating circuit coupled to the current control node.

8. A timing circuit as claimed in claim 1 wherein the current source circuit comprises a controlled current source, a first transistor in series with the controlled current source, and a second transistor supplying the current to the delay element, the controlled current control mode being between the first transistor and the current source, the differential amplifier driving the gates of the first and second transistors.

9. A timing circuit as claimed in claim 8 further comprising an RC compensating circuit coupled to the current control node.

10. A timing circuit as claimed in claim 1 further comprising a voltage regulator in combination with the current source circuit.

11. A timing circuit as claimed in claim 10 wherein the voltage regulator compares a voltage applied to the delay element with a reference voltage to control a current set point applied to the current source circuit.

12. A timing circuit as claimed in claim 1 coupled as a voltage-controlled oscillator.

13. A timing circuit as claimed in claim 1 in combination with a phase comparator in a phase-locked loop.

14. A timing circuit as claimed in claim 1 in combination with a phase comparator in a delay-locked loop.

15. A timing circuit as claimed in claim 1 coupled as a clock buffer.

16. A timing circuit as claimed in claim 1 wherein the current control node is in series with a cascoded current source.

17. A method of providing power to a delay element comprising:

supplying current to the delay element through a supply node; and comparing the voltage on the supply node to a voltage on a current control node to control the supplied current.

18. A method as claimed in claim 17 wherein the delay element includes a CMOS inverter.

19. A method as claimed in claim 17 wherein the delay element is a differential CMOS inverter.

20. A method as claimed in claim 17 wherein reference current is sourced through a first transistor and current is supplied to the delay element through a second transistor, terminals of the first and second transistors being held at substantially the same voltage by a differential amplifier.

21. A method as claimed in claim 20 wherein the differential amplifier is an operational amplifier.

22. A method as claimed in claim 21 wherein the operational amplifier has a wide output voltage swing.

23. A method as claimed in claim 17 further comprising phase compensating a current supply to the delay element with an RC circuit coupled to the current control node.

24. A method as claimed in claim 17 further comprising sourcing current through a first transistor from a controlled current source, the current control node being between the first transistor and the controlled current source, and supplying current to the delay element through a second transistor, the voltage on the supply node being compared to the voltage on a current control node through a differential amplifier which drives the gates of the first and second transistors.

25. A method as claimed in claim 24 further comprising an RC compensating circuit coupled to the current control node.

26. A method as claimed in claim 17 further comprising regulating a control input to the current control node through a voltage regulator.

27. A method as claimed in claim 26 wherein the voltage regulator compares a voltage applied to the delay element with a reference voltage to control a current set point of the supplied current.

28. A method as claimed in claim 27 wherein the delay element is coupled in a voltage-controlled oscillator.

29. A method as claimed in claim 17 further comprising making a phase comparison in a phase-locked loop.

30. A method as claimed in claim 17 further comprising making a phase comparison in a delay-locked loop.

31. A method as claimed in claim 17 wherein the delay element is included in a clock buffer.

32. A method as claimed in claim 17 further comprising drawing current from the current control node through a cascoded current source.

33. A timing circuit comprising:

delay means; and current source means for supplying current to the delay element through a supply node, the current source means comparing the voltage on the supply node to a voltage on a current control node to control the supply of current.

34. A timing circuit as claimed in claim 1 further comprising a negative feedback loop from the output of the differential amplifier through the current control node.

35. A method as claimed in claim 17 further comprising providing negative feedback from the output of the differential amplifier through the current control node.

* * * * *